(12) United States Patent
Takahashi et al.

(10) Patent No.: US 6,194,926 B1
(45) Date of Patent: Feb. 27, 2001

(54) OPERATION TIMING CONTROLLABLE SYSTEM

(75) Inventors: Satoshi Takahashi; Hiroyuki Yamauchi, both of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/291,173

(22) Filed: Apr. 14, 1999

(30) Foreign Application Priority Data

Apr. 16, 1998 (JP) .................................................. 10-106365

(51) Int. Cl.[7] ........................................................ H03L 7/00
(52) U.S. Cl. ............................ 327/144; 327/291; 327/295
(58) Field of Search ..................................... 327/144, 291, 327/295, 296

(56) References Cited

U.S. PATENT DOCUMENTS 4,644,195 * 2/1987 Miller et al. .......................... 327/107
4,686,480 * 8/1987 Katto et al. .......................... 327/176

FOREIGN PATENT DOCUMENTS

| 4-302014 | 10/1992 | (JP) . |
| 9-34580 | 6/1996 | (JP) . |
| 10-91274 | 4/1998 | (JP) . |

* cited by examiner

Primary Examiner—Kenneth B. Wells
Assistant Examiner—Paul Dinh
(74) Attorney, Agent, or Firm—Harness, Dickey & Pierce, P.L.C.

(57) ABSTRACT

A system of the type including a plurality of circuit blocks is provided with an operation timing controller for controlling the operation timing of these circuit blocks by supplying associated operation control signals thereto. The operation timing controller includes a memory for memorizing respective times when a peak current state arises in these circuit blocks, thereby controlling the timing of the operation control signals in accordance with the memorized times when the peak current state arises. As a result, coincident switching noise can be suppressed no matter when the peak current state arises in these circuit blocks.

7 Claims, 9 Drawing Sheets

Fig. 9

|    | Tm1 | Tm2 | Tm3 | BCK1 | BCK2 | BCK3 |
|----|-----|-----|-----|------|------|------|
| 1  | 00  | 00  | 00  | STM1 | STM2 | STM3 |
| 2  | 00  | 00  | 01  | STM1 | STM3 | STM1 |
| 3  | 00  | 00  | 10  | STM1 | STM2 | STM1 |
| 4  | 00  | 01  | 00  | STM1 | STM1 | STM3 |
| 5  | 00  | 01  | 01  | STM1 | STM1 | STM2 |
| 6  | 00  | 01  | 10  | STM1 | STM1 | STM1 |
| 7  | 00  | 10  | 00  | STM1 | STM1 | STM2 |
| 8  | 00  | 10  | 01  | STM1 | STM1 | STM1 |
| 9  | 00  | 10  | 10  | STM1 | STM1 | STM3 |
| 10 | 01  | 00  | 00  | STM1 | STM1 | STM3 |
| 11 | 01  | 00  | 01  | STM1 | STM1 | STM2 |
| 12 | 01  | 00  | 10  | STM1 | STM1 | STM1 |
| 13 | 01  | 01  | 00  | STM1 | STM2 | STM1 |
| 14 | 01  | 01  | 01  | STM1 | STM2 | STM3 |
| 15 | 01  | 01  | 10  | STM1 | STM3 | STM1 |
| 16 | 01  | 10  | 00  | STM1 | STM1 | STM1 |
| 17 | 01  | 10  | 01  | STM1 | STM1 | STM3 |
| 18 | 01  | 10  | 10  | STM1 | STM1 | STM2 |
| 19 | 10  | 00  | 00  | STM1 | STM1 | STM2 |
| 20 | 10  | 00  | 01  | STM1 | STM1 | STM1 |
| 21 | 10  | 00  | 10  | STM1 | STM1 | STM3 |
| 22 | 10  | 01  | 00  | STM1 | STM1 | STM1 |
| 23 | 10  | 01  | 01  | STM1 | STM1 | STM3 |
| 24 | 10  | 01  | 10  | STM1 | STM1 | STM2 |
| 25 | 10  | 10  | 00  | STM1 | STM3 | STM1 |
| 26 | 10  | 10  | 01  | STM1 | STM2 | STM1 |
| 27 | 10  | 10  | 10  | STM1 | STM2 | STM3 |

OPERATION TIMING CONTROLLABLE SYSTEM

BACKGROUND OF THE INVENTION

The present invention relates to a system including a plurality of circuit blocks, and more particularly relates to a technique of controlling operation timing in such a manner as to suppress coincident switching noise.

In recent years, a semiconductor integrated circuit is composed of a plurality of circuit blocks in many cases. For example, a microcontroller unit (MCU) is made up of CPU, memory and other circuit blocks of numerous types.

Under the circumstances such as these, noise is more likely to be caused these days in a semiconductor integrated circuit mainly because of charging and discharging of gate and line capacitances formed by the increased number of circuit blocks included. If these circuit blocks charge and discharge simultaneously, then large noise is caused within the overall system. Such noise is generally called "coincident switching noise".

In a prior art technique for suppressing the coincident switching noise in a system including a plurality of circuit blocks, a delay circuit is provided for delaying a reference clock signal externally supplied. In this configuration, each circuit block is selectively supplied with the reference clock signal or a delayed clock signal responsive to a switching signal. This technique is disclosed in Japanese Laid-Open Publication No. 10-91274, for example.

In some of real-world circuits, a peak current state arises immediately after a clock signal has risen. In other circuits, however, the occurrence of the peak current state is delayed for some time after a clock signal has risen. For instance, if a large-scale combinatorial circuit, included in a circuit block, starts to operate later than a clock signal supplied to the circuit block, then the occurrence of a peak current state in this circuit block is delayed for a while after the clock signal has risen. Also, the delay time is variable with the internal configuration of a specific circuit block.

The prior art identified above supposes that a peak current state always arises soon after a clock signal has risen, and pays no attention to the possibilities that the peak current state may at different times in respective circuit blocks. Accordingly, in accordance with this technique, if a circuit block, where a peak current state arises later than the leading edge of a clock signal, is included in a system, then the coincident switching noise cannot always be suppressed.

SUMMARY OF THE INVENTION

An object of the present invention is ensuring the suppression of coincident switching noise for a system including a plurality of circuit blocks no matter when the peak current state arises in these circuit blocks.

Specifically, an operation timing controllable system according to the present invention includes: a plurality of circuit blocks; and means for controlling operation timing of the circuit blocks by supplying associated operation control signals thereto. The operation timing control means memorizes respective times when a peak current state occurs in the individual circuit blocks responsive to the associated operation control signals, and controls the timing of the operation control signals in accordance with the memorized times when the peak current state occurs.

According to the present invention, the times when the peak current state arises in the individual circuit blocks responsive to the associated operation control signals are memorized at the operation timing control means. And the timing of the operation control signals is controlled in accordance with the memorized times when the peak current state arises. Thus, even it the peak current state arises at respectively different times in the individual circuit blocks, the coincident switching noise can be suppressed with a lot more certainty.

In one embodiment of the present invention, the control means preferably controls the timing of the operation control signals such that the peak current state arises at discrete time in the respective circuit blocks.

In another embodiment, the control means preferably includes: a signal generator for generating a plurality of timing signals at respectively different times in response to a reference clock signal; and a signal selector for selecting any of the timing signals, generated by the signal generator, as associated one of the operation control signals to be supplied to each said circuit block.

Another operation timing controllable system according to the present invention includes: a plurality of circuit blocks; and means for controlling operation timing of the circuit blocks by supplying associated operation control signals thereto. Each said circuit block includes a peak current detector for detecting a time when a peak current state arises in the circuit block responsive to associated one of the operation control signals supplied thereto. The operation timing control means controls the timing of the operation control signals in accordance with the times, at which the peak current state arises in the respective circuit blocks and which have been detected by the peak current detectors.

According to the present invention, a peak current detector, provided for each circuit block, detects a time when the peak current state arises in the circuit block responsive to associated one of the operation control signals supplied thereto. And the timing of the operation control signals is controlled in accordance with the times when the peak current state arises in the respective circuit blocks. Thus, even if the peak current state arises at respectively different times in the individual circuit blocks, the coincident switching noise can be suppressed with a lot more certainty.

In one embodiment of the present invention, the peak current detector preferably includes: a resistor inserted in a current supply path between a power supply and the circuit block associated with the detector; and a comparator with an offset voltage for receiving a voltage difference between both terminals of the resistor as a differential input.

In another embodiment, the control means preferably controls the timing of the operation control signals such that the peak current state arises at discrete times among the circuit blocks.

In still another embodiment, the control means preferably includes: a signal generator for generating a plurality of timing signals at respectively different times in response to a reference clock signal; and a signal selector for selecting any of the timing signals, generated by the signal generator, as associated one of the operation control signals to be supplied to each said circuit block.

BRIEF DESCRIPTION OF THE DRAWINGS

FIG. 9 is a table showing a relationship between the timing information and the operation control signals.

DESCRIPTION OF THE PREFERRED EMBODIMENTS

Hereinafter, preferred embodiments of the present invention will be described with reference to the accompanying drawings.

Embodiment 1

Figure 1:
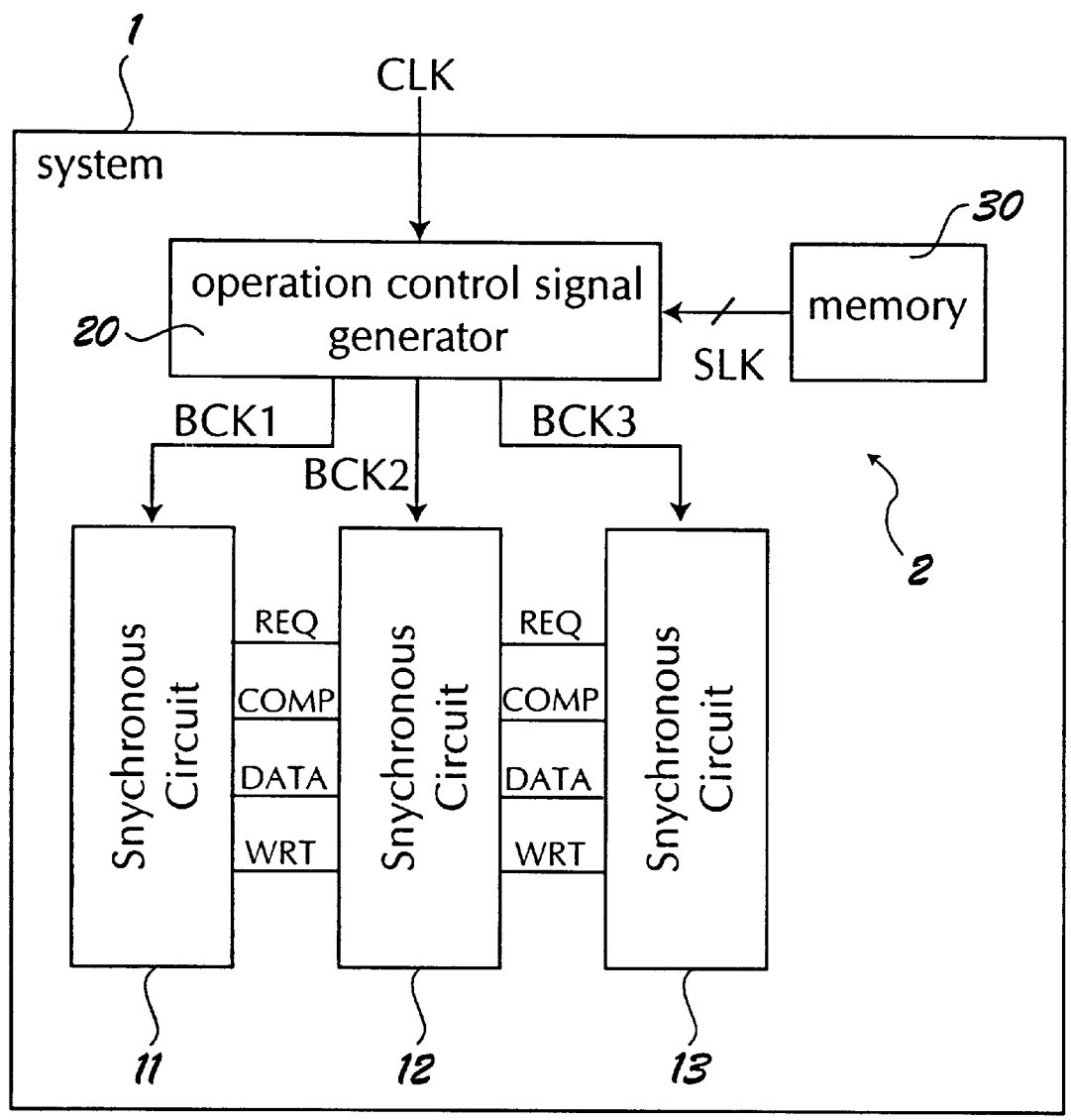
FIG. 1 is a block diagram illustrating a schematic configuration of an operation timing controllable system according to a first exemplary embodiment of the present invention.

FIG. 1 illustrates a schematic configuration of an operation timing controllable system according to a first exemplary embodiment of the present invention. In FIG. 1, the system 1 includes first, second and third circuit blocks 11, 12 and 13 (hereinafter, simply referred to as "blocks"). Responsive to a clock signal CLK, an operation control signal generator 20 generates first, second and third operation control signals BCK1, BCK2 and BCK3 to be supplied to these blocks 11, 12 and 13, respectively, for controlling the operation timing thereof.

A memory 30 memorizes the respective times when a peak current state arises in the individual blocks 11, 12 and 13 responsive to the operation control signals BCK1, BCK2 and BCK3 supplied thereto, and outputs a select signal SLK based on the memorized times when the peak current state arises. In response to the select signal SLK, the operation control signal generator 20 controls the timing of the respective operation control signals BCK1, BCK2 and BCK3. In this embodiment, the operation control signal generator 20 and the memory 30 are implemented as exemplary operation timing control means 2 defined in the appended claims.

The respective blocks 11 through 13 are synchronous circuits and operate responsive to the operation control signals BCK1, BCK2 and BCK3 supplied thereto as synchronous clock signals. Also, handshaking is performed among these blocks 11, 12 and 13 using request signal REQ, completion signal COMP, data signal DATA and write signal WRT.

Figure 2:
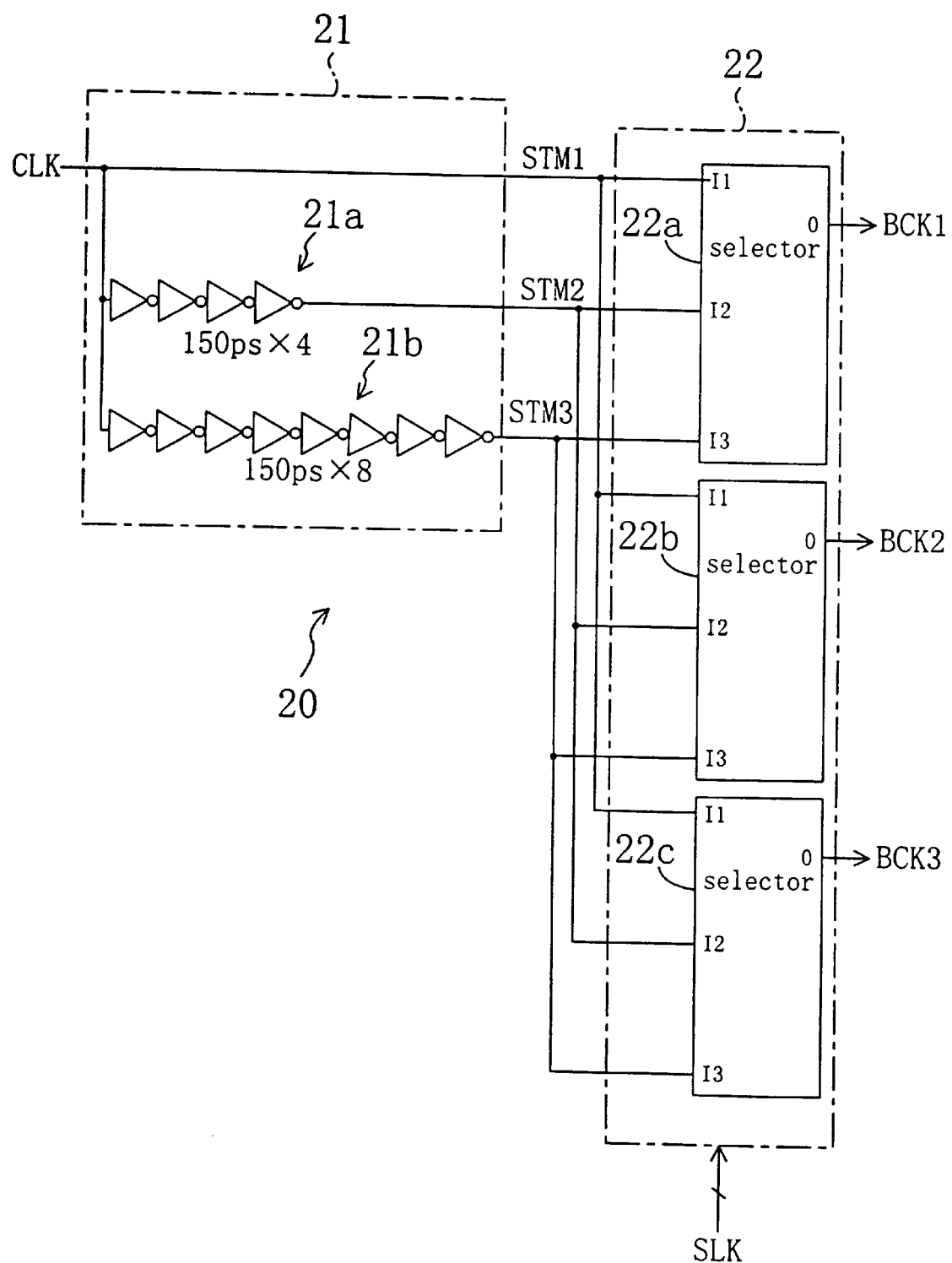
FIG. 2 is a block diagram illustrating a configuration of the operation control signal generator shown in FIG. 1.

FIG. 2 illustrates a configuration of the operation control signal generator 20 shown in FIG. 1. As shown in FIG. 2, the operation control signal generator 20 includes a signal generator 21 and a signal selector 22. The signal generator 21 generates three types of timing signals STM1, STM2, STM3 responsive to the clock signal CLK. In response to the select signal SLK, the signal selector 22 selects the operation control signals BCK1, BCK2 and BCK3 associated with the blocks 11 through 13, respectively, from the three types of timing signals STM1, STM2 and STM3 generated by the signal generator 21.

The signal generator 21 includes a first delay device 21a including four inverters and a second delay device 21b including eight inverters. That is to say, the signal generator 21 outputs the input clock signal CLK as the first timing signal STM1 without delaying it at all. The signal generator 21 also outputs the clock signal CLK as the second and third timing signals STM2 and STM3 after having the signal delayed by the first and second delay devices 21a and 21b for respective amounts of time. The signal selector 22 includes three selectors 22a, 22b and 22c. Each of the selectors 22a, 22b and 22c selectively outputs one of the timing signals STM1, STM2 and STM3 as associated one of the operation control signals BCK1, BCK2 and BCK3 for the blocks 11, 12 and 13, respectively.

Figure 3:
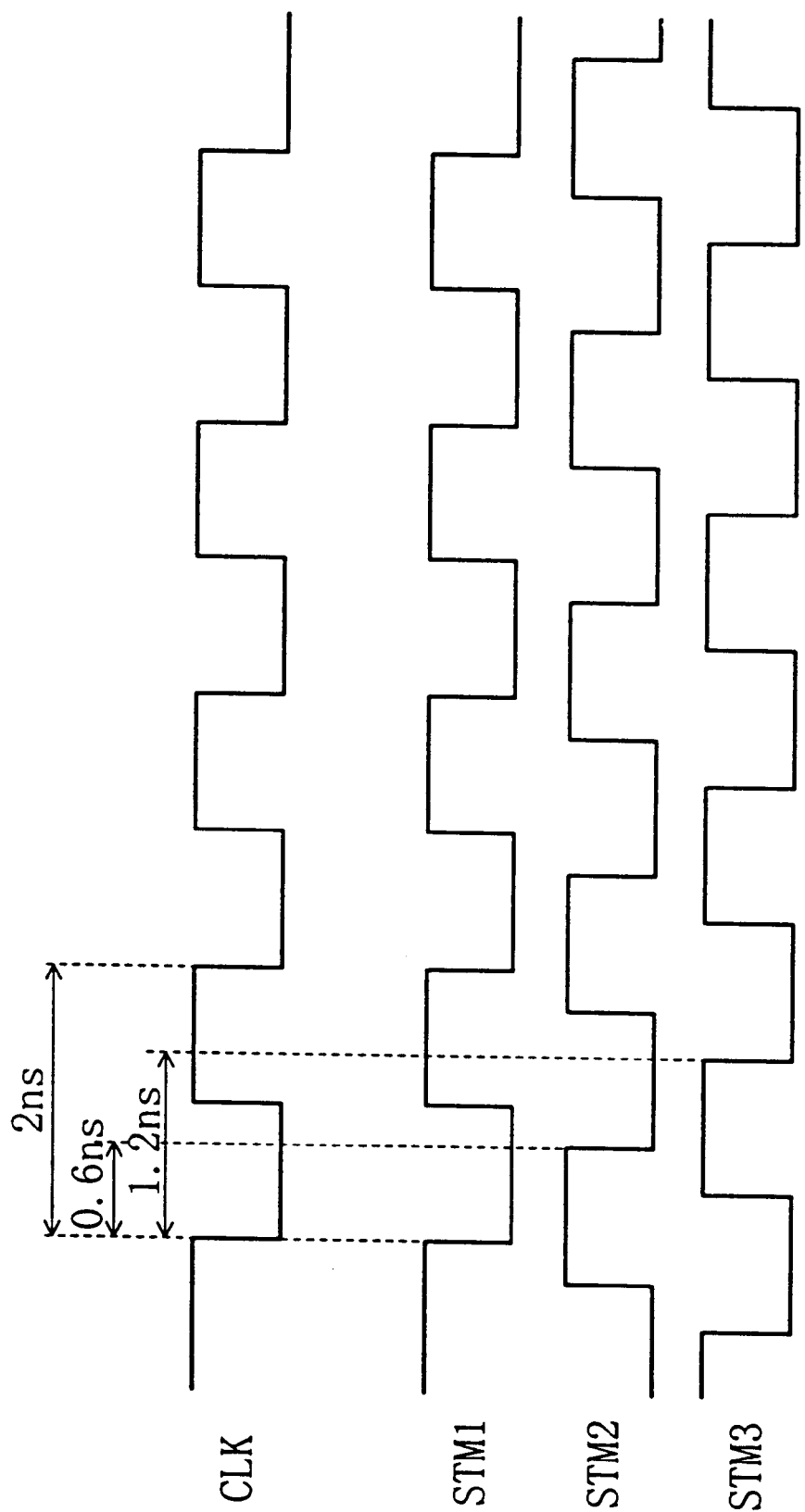
FIG. 3 is a timing diagram illustrating level transitions of a clock signal and first, second and third timing control signals with time.

FIG. 3 illustrates level transitions of the clock signal CLK and the first, second and third timing signals STM1, STM2 and STM3 with time. Suppose the delay caused by each of the inverters, included in the first and second delay devices 21a and 21b, is 150 picoseconds (ps). Then, the second timing signal STM2 is delayed from the first timing signal STM1 for 0.6 nanoseconds (ns), while the third timing signal STM3 is delayed from the first timing signal STM1 for 1.2 ns as shown in FIG. 3.

Figure 4:
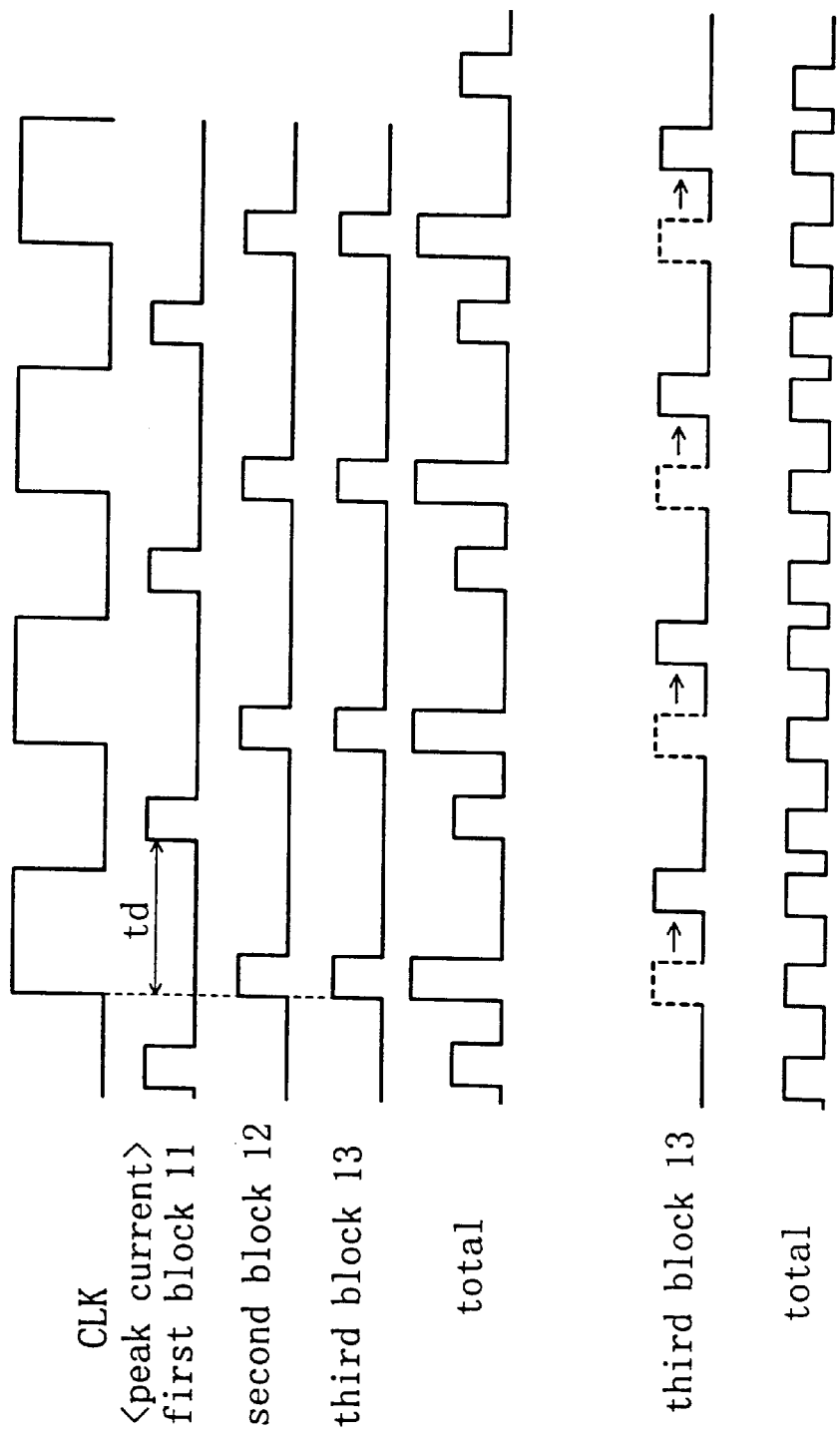
FIG. 4 is a diagram illustrating how the timing of operation control signals is controlled in accordance with the times when a peak current state arises.

Next, it will be described with reference to FIG. 4 how the timing of the operation control signals BCK1, BCK2 and BCK3 is controlled in accordance with the times when a peak current state arises.

The respective times when the peak current state arises responsive to the clock signal CLK are defined in advance for the blocks 11 through 13 in the system 1 shown in FIG. 1. Suppose the peak current state arises in the first block 11 later than a leading edge of the clock signal CLK by a time interval td, while the peak current state arises in the second and third blocks 12 and 13 in synchronism with the leading edge of the clock signal CLK as shown in FIG. 4. Since the peak current state arises in the second and third blocks 12 and 13 at the same time in this case, a so-called "coincident switching" problem happens.

In order to solve this problem, the second timing signal STM2, which is delayed from the clock signal CLK by the delay caused by the first delay device 21a, is supplied as the operation control signal BCK3 to the third block 13, for example. Then, the peak current state arises in the third block 13 at a different time. As a result, as shown in the lower-most waveform in FIG. 4, the peak currents are averaged in the overall system 1 and the coincident switching noise can be reduced.

That is to say, the operation timing control means 2 can control the timing of the operation control signals BCK1, BCK2 and BCK3 such that the peak current state arises at discrete times in the respective blocks 11 through 13.

Figure 5:
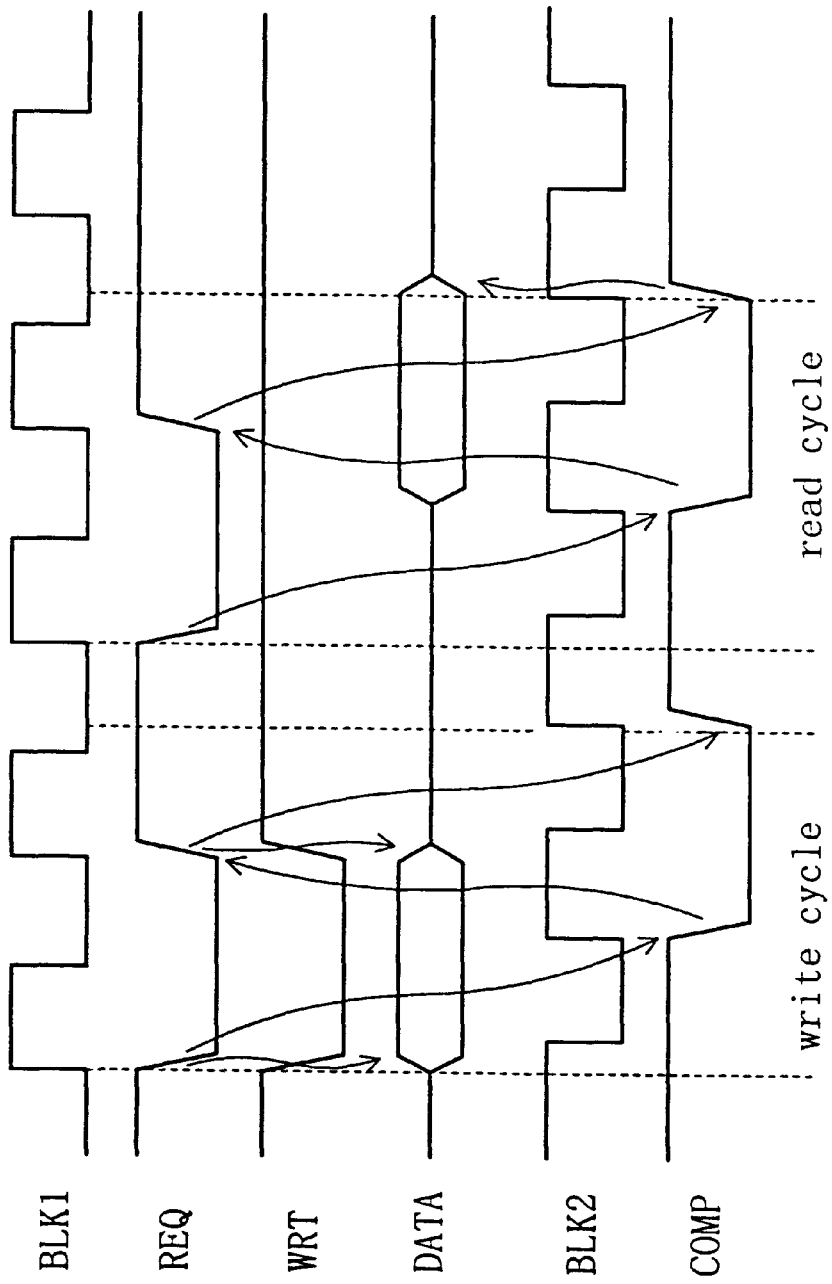
FIG. 5 is a timing diagram illustrating handshaking among respective blocks.

FIG. 5 illustrates handshaking among the respective blocks 11 through 13. In the following example, exchange of data between the first and second blocks 11 and 12 will be described.

First, a write cycle, i.e., writing data from the first block 11 into the second block 12, will be described. First, the first block 11 negates the request signal REQ and the write signal WRT and starts to output the data signal DATA at the same time. Responsive to the data signal DATA, the second block 12 negates the completion signal COMP. Having confirmed that the completion signal COMP has been negated, the first block 11 asserts the request signal REQ and the write signal WRT, and finishes outputting the data signal DATA at the same time. Having confirmed that the request signal REQ has been asserted, the second block 12 asserts the completion signal COMP to end the write cycle.

Next, a read cycle, during which the first block 11 reads out data from the second block 12, will be described. First, the first block 11 negates only the request signal REQ without outputting the write signal WRT and the data signal DATA. In response to the request signal REQ, the second block 12 prepares the requested data and outputs the data signal DATA and the completion signal COMP. On receiving the data signal DATA, the first block 11 asserts the request signal REQ. Having confirmed that the request signal REQ has been asserted, the second block 12 finishes outputting the data signal DATA and asserts the completion signal COMP to end the read cycle.

By establishing such a handshaking communication, data can be exchanged among the respective blocks 11 through 13, even if these blocks 11 through 13 start to operate at respectively different times.

It should be noted that the memory for memorizing the times when a peaks current state arises may be provided within the respective blocks.

Also, a system, operative at several different operation frequencies, should preferably be configured to supply the operation control signals, associated with these operation frequencies, to the respective blocks. That is to say, the peak current state may arise at respectively different times in accordance with the operation frequencies. Accordingly, in order to bring about the peak current state at discrete times, operation control signals, associated with respective operation frequencies, should be supplied. In such a case, select signals SLK, corresponding to the respective operation frequencies, should be stored in the memory 30, and the same number of signal generators 21 as that of the operation frequencies should be provided for the operation control signal generator 20.

Embodiment 2

Figure 6:
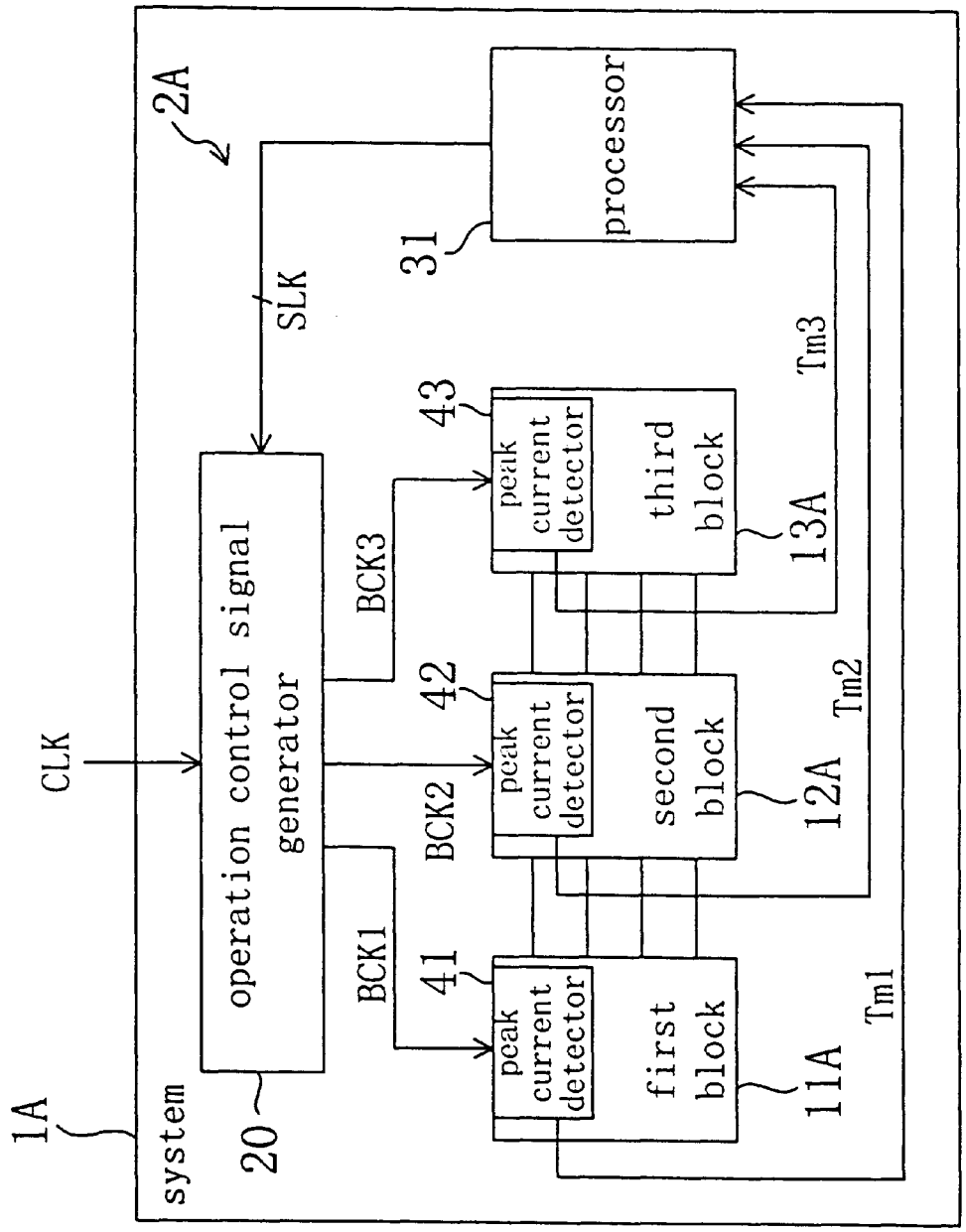
FIG. 6 is a block diagram illustrating a schematic configuration of an operation timing controllable system according to a second exemplary embodiment of the present invention.

FIG. 6 illustrates a schematic configuration of an operation timing controllable system 1A according to a second exemplary embodiment of the present invention. As shown in FIG. 6, the system 1A includes first, second and third blocks 11A, 12A and 13A. Each of these blocks 11A, 12A and 13A includes a peak current detector 41, 42 or 43 for detecting a time when the peak current state arises responsive to an associated operation control signal BCK1, BCK2 or BCK3 supplied.

The peak current detectors 41, 42 and 43 respectively supply the timing information Tm1, Tm2 and Tm3 about the peak currents detected to a processor 31. In accordance with the peak current timing information Tm1, Tm2 and Tm3 received, the processor 31 outputs the select signal SLK. The operation control signal generator 20 has the same configuration as that described in the first embodiment and controls the timing of the respective operation control signals BCK1, BCK2 and BCK3 responsive to the select signal SLK supplied from the processor 31. In this embodiment, the operation control signal generator 20 and the processor 31 constitute operation timing control means 2A defined in the appended claims.

The respective blocks 11A, 12A and 13A are synchronous circuits and operate responsive to the operation control signals BCK1, BCK2 and BCK3 supplied thereto as synchronous clock signals. Also, handshaking is established among these blocks 11A, 12A and 13A using request signal REQ, completion signal COMP, data signal DATA and write signal WRT as in the first embodiment.

Figure 7:
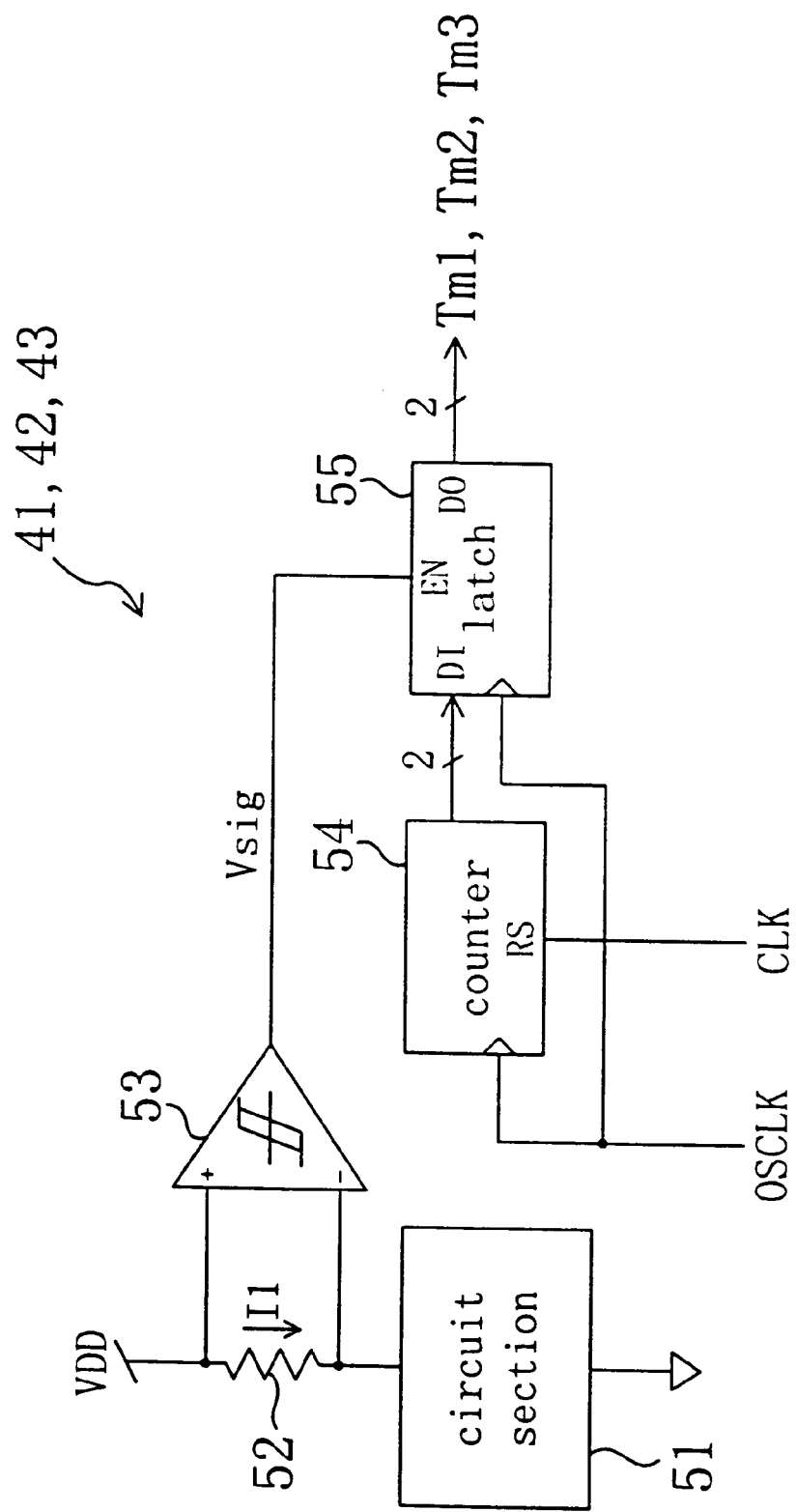
FIG. 7 is a diagram illustrating a configuration of the peak current detector shown in FIG. 6.

FIG. 7 illustrates a configuration of the peak current detectors 41, 42 and 43 shown in FIG. 6. As shown in FIG. 7, each peak current detector 41, 42 or 43 includes: a resistor 52 provided between a power supply VDD and a circuit section 51; and a comparator 53 with an offset voltage for receiving a voltage difference between both terminals of the resistor 52 as a differential input thereof. For example, suppose the resistance of the resistor 52 is 0.5Ω and the offset voltage of the comparator 53 is 0.1 V. In such a case, when the current I1 flowing from the power supply VDD toward the circuit section 51 exceeds 200 mA, the comparator 53 outputs "1" as the output voltage Vsig thereof. That is to say, when the current I1 exceeds 200 mA, the current can be detected as the peak current. The resistance of the resistor 52 is set at such a value that the voltage drop thereof does not affect the operation of the circuit section 51.

Each peak current detector 41, 42 or 43 further includes a counter 54 and a latch 55. The counter 54 (composed of two bits in this example) counts over-sampled clock signals OSCLK. When the output signal Vsig of the comparator 53 is "1", the latch 55 is enabled to latch the output of the counter 54 in synchronism with the edge of the over-sampled clock signal OSCLK. The output of the latch 55 is supplied as the peak current timing information Tm1, Tm2 and Tm3. The counter 54 is reset responsive to the original clock signal CLK.

Figure 8:
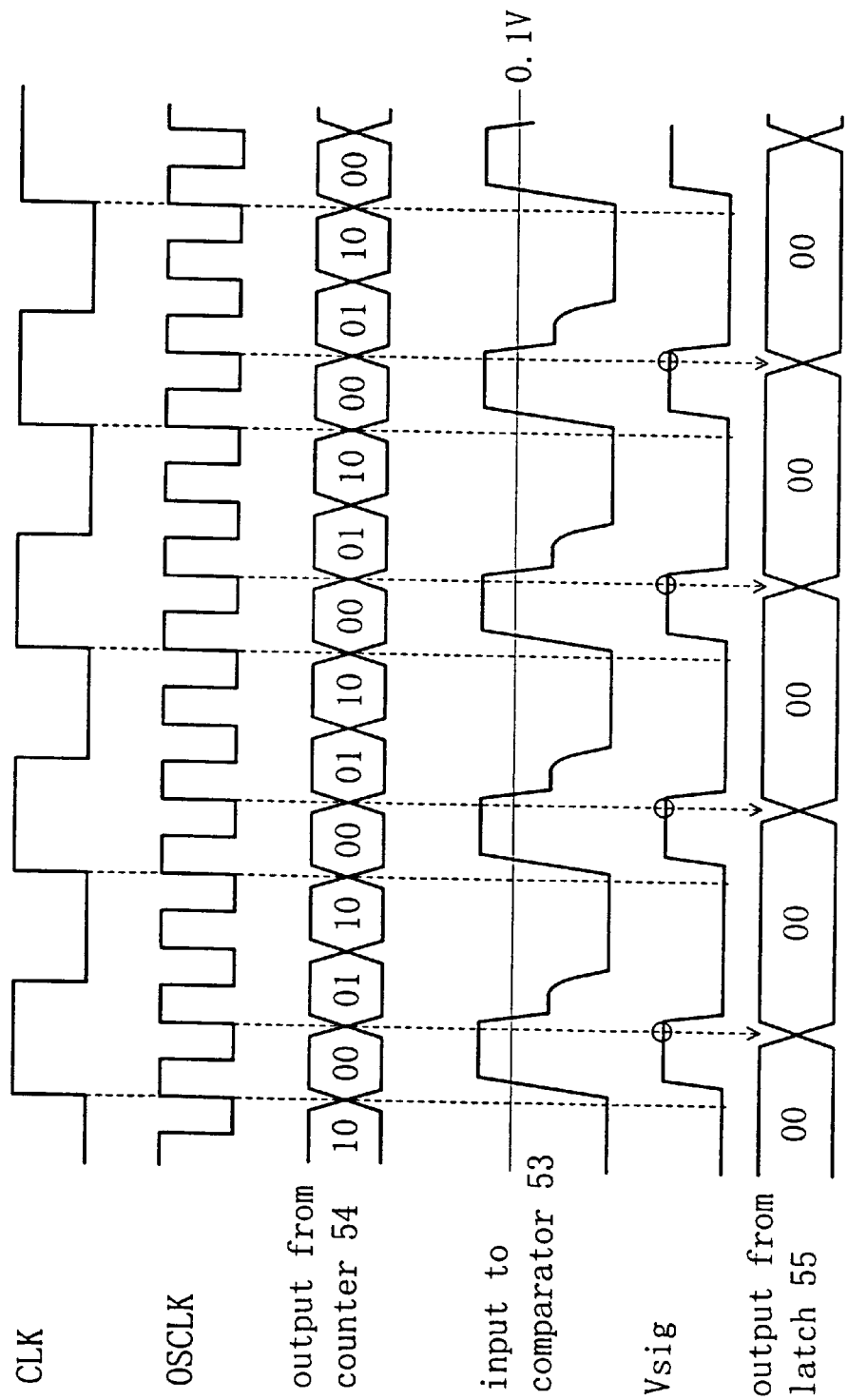
FIG. 8 is a timing diagram illustrating the operation of the peak current detector shown in FIG. 7.

FIG. 8 illustrates the operation of the peak current detector 41, 42 or 43 shown in FIG. 7. In FIG. 8, the over-sampled clock signal OSCLK is supposed to have a frequency three times as high as that of the original clock signal CLK. As shown in FIG. 8, the counter 54 counts the over-sampled clock signal OSCLK and is reset responsive to the original clock signal CLK. Accordingly, the counter 54 repeatedly outputs three kinds of values "00", "01" and "10". While the input to the comparator 53, i.e., the voltage difference between both terminals of the resistor 52, is higher than 0.1 V, the comparator 53 continues to output "1" as the output signal Vsig. During this interval, the latch 55 is enabled. When the over-sampled clock signal OSCLK rises while the latch 55 is being enabled, the latch 55 latches the output of the counter 54. In the example shown in FIG. 8, "00" is latched by the latch 55 and output as the peak current timing information Tm1, Tm2 and Tm3.

The timing information Tm1, Tm2 and Tm3, which is a digital value representing a time when the peak current state arises during a cycle of the clock signal CLK, can be output by the peak current detector 41, 42 or 43 having such a configuration.

FIG. 9 illustrates a relationship between the timing information Tm1, Tm2 and Tm3 and the operation control signals BCK1, BCK2 and BCK3. Responsive to the peak current timing information Tm1, Tm2 and Tm3 supplied from the respective peak current detectors 41, 42 and 43, the processor 31 generates and outputs the select signal SLK to the operation control signal generator 20 such that the operation control signals BCK1 through BCK3 are output therefrom based on the relationship shown in FIG. 9.

That is to say, the operation timing control means 2A can control the timing of the operation control signals BCK1, BCK2 and BCK3 such that the peak current state arises at discrete times in respective blocks 11A, 12A and 13A.

Alternatively, the processor 31 may be replaced with any other component that can generate and output the select signal SLK based on the relationship shown in FIG. 9. For example, the select signal SLK may be read out by storing the relationship shown in FIG. 9 in a ROM and specifying respective addresses associated the timing information Tm1, Tm2 and Tm3.

In a system using a semiconductor device such as a transistor, a delay time is greatly variable with a change in temperature, for example. Even if a delay time in a system is 3 ns at 27° C., the delay time might sometimes increases to 5 ns at 125° C. As the delay time changes in this manner, the peak current state also arises at a different time correspondingly. Accordingly, it is very effective to always detect the time when a peak current state arises and thereby newly select the operation control signal every time the occurrence of the peak current state is detected.

It is noted that the frequency of the over-sampled clock signal and the number of bits of the counter are not limited to those exemplified above, but may be arbitrarily selected to satisfy the required precision with which the occurrence of a peak current state is detected. Also, a plurality of comparators with mutually different offset voltages may be used to improve the precision with which the occurrence of a peak current state is detected. In such a case, an appropriate logic circuit may be provided between the output of each comparator and the enable input of the latch.

As is apparent from the foregoing description, the timing of the operation control signals is controlled in accordance with respective times when a peak current state arises, which have been memorized in advance or detected by the peak current detectors, according to the present invention. Thus, even if a peak current state arises at respectively different times in a plurality of circuit blocks, the coincident switching noise can be suppressed with a lot more certainty.

What is claimed is:

1. An operation timing controllable system comprising:

a plurality of circuit blocks; and means for controlling operation timing of the circuit blocks by supplying associated operation control signals thereto, wherein the operation timing control means memorizes respective times, when a peak current state arises in the individual circuit blocks responsive to the associated operation control signals, and controls the timing of the operation control signals in accordance with the memorized times when the peak current state arises.

2. The system of claim 1, wherein the control means controls the timing of the operation control signals such that the peak current state arises at discrete times among the circuit blocks.

3. The system of claim 1, wherein the control means comprises:

a signal generator for generating a plurality of timing signals at respectively different times in response to a reference clock signal; and a signal selector for selecting any of the timing signals, generated by the signal generator, as associated one of the operation control signals to be supplied to each said circuit block.

4. An operation timing controllable system comprising:

a plurality of circuit blocks; and means for controlling operation timing of the circuit blocks by supplying associated operation control signals thereto, wherein each said circuit block includes a peak current detector for detecting a time when a peak current state arises in the circuit block responsive to associated one of the operation control signals supplied thereto, and wherein the operation timing control means controls the timing of the operation control signals in accordance with the times, at which the peak current state arises in the respective circuit blocks and which have been detected by the peak current detectors.

5. The system of claim 4, wherein the peak current detector comprises:

a resistor inserted in a current supply path between a power supply and the circuit block associated with the detector; and a comparator with an offset voltage for receiving a voltage difference between both terminals of the resistor as a differential input.

6. The system of claim 4, wherein the control means controls the timing of the operation control signals such that the peak current state arises at discrete times among the circuit blocks.

7. The system of claim 4, wherein the control means comprises:

a signal generator for generating a plurality of timing signals at respectively different times in response to a reference clock signal; and a signal selector for selecting any of the timing signals, generated by the signal generator, as associated one of the operation control signals to be supplied to each said circuit block.

* * * * *